(12) United States Patent
Shimoda et al.

(10) Patent No.: US 6,583,580 B2
(45) Date of Patent: Jun. 24, 2003

(54) EL ELEMENT DRIVING CIRCUIT AND METHOD, AND ELECTRONIC APPARATUS

(75) Inventors: Tatsuya Shimoda, Suwa (JP); Satoru Miyashita, Suwa (JP); Satoshi Inoue, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/900,758

(22) Filed: Jul. 6, 2001

(65) Prior Publication Data

US 2002/0140363 A1 Oct. 3, 2002

(30) Foreign Application Priority Data

Jul. 7, 2000 (JP) ........................................ 2000-207393

(51) Int. Cl.[7] ................................................ H05K 7/02
(52) U.S. Cl. .................. 315/169.3; 361/782; 315/169.1
(58) Field of Search ........................... 315/169.1–169.4, 315/165, 167; 345/60, 64, 71, 72, 75, 76, 80; 323/222, 282; 361/762–764, 782

(56) References Cited

U.S. PATENT DOCUMENTS

| 5,545,291 | A | | 8/1996 | Smith et al. .............. 156/655.1 |
| 5,783,856 | A | | 7/1998 | Smith et al. ................ 257/618 |
| 5,824,186 | A | | 10/1998 | Smith et al. .............. 156/655.1 |
| 5,904,545 | A | | 5/1999 | Smith et al. ................ 438/455 |
| 5,959,846 | A | * | 9/1999 | Noguchi et al. ............ 361/782 |
| 6,297,622 | B1 | * | 10/2001 | Yatabe ........................ 323/222 |

* cited by examiner

*Primary Examiner*—Don Wong
*Assistant Examiner*—Wilson Lee
(74) *Attorney, Agent, or Firm*—Harness, Dickey & Pierce, P.L.C.

(57) ABSTRACT

An EL driving circuit which can operate at a satisfactory operation speed is disclosed. A voltage higher than the voltage for operating the EL element is input, and the input voltage is stepped down by the voltage step-down circuit (2) which is provided in each unit block (1). The stepped-down voltage is then supplied to a transistor (3) functioning as the driving element for driving the EL element. Therefore, even when the number of EL elements increases, sufficient source voltage can be supplied to each unit block.

8 Claims, 6 Drawing Sheets

EL ELEMENT DRIVING CIRCUIT AND METHOD, AND ELECTRONIC APPARATUS

BACKGROUND OF THE INVENTION

1. Field of the Invention

The present invention relates to an electroluminescence (abbreviated as "EL", hereinbelow) element driving circuit, an EL element driving method, and an electronic apparatus using the EL element driving circuit, and in particular, to an EL element driving circuit and method using a driving element formed in a unit block.

2. Description of the Related Art

Organic electroluminescence (EL) elements are light emitting elements which are called organic light emitting diodes. EL elements, driven by a low DC voltage, emit high-brightness light and are high-efficiency elements; thus, EL elements are anticipated to be used for next-generation flat-panel displays.

In a known method for making a display panel using organic EL elements, a substrate is divided into block substrates (i.e., unit blocks), each having a side of a few tens or hundreds of micrometers, and these unit blocks are arranged on another substrate having concave portions or the like which have been formed in advance. According to this method, substandard blocks can be removed in advance; therefore, this method is suitable for making a display panel. When this method is employed, a driving element, such as a transistor, for driving an organic EL element is formed in each unit block in advance.

The above-explained unit block is provided for each EL element in a one-to-one correspondence. Therefore, as the number of pixels increases, the number of EL elements also increases, thereby increasing the number of unit blocks. In this case, the capacity assigned to scanning lines and data lines for supplying signals to each unit block must be large, and the driving time must be longer.

SUMMARY OF THE INVENTION

In order to solve the above problems, an object of the present invention is to provide an EL driving circuit which can operate at a satisfactory operation speed, and an EL driving method for implementing such an operation.

Therefore, the present invention provides an EL element driving circuit for driving EL elements, provided by mounting unit blocks in a substrate, each of the unit blocks having a driving element for driving an EL element according to a supplied signal, the circuit comprising:

a voltage step-down circuit, provided in each of the unit blocks, for stepping down the voltage of said supplied signal to a predetermined voltage level, and the signal having the stepped-down voltage being supplied to the driving element for driving the EL element.

Therefore, the input source voltage is higher than a voltage for operating the EL element. Typically, said substrate has a plurality of concave portions into which the unit blocks are to be fit, and the unit blocks are fit into the concave portions in a liquid.

The present invention also provides an EL element driving method of driving EL elements, implemented by mounting unit blocks in a substrate, each of the unit blocks having a driving element for driving an EL element according to a supplied signal, the method comprising the steps of:

stepping down the voltage of said supplied signal to a predetermined voltage level by a voltage step-down circuit provided in each unit block; and supplying the signal having the stepped-down voltage to the driving element for driving the EL element.

Therefore, the input source voltage is higher than a voltage for operating the EL element. Typically, said substrate has a plurality of concave portions into which the unit blocks are to be fit, and the unit blocks are fit into the concave portions in a liquid.

Accordingly, a voltage higher than the voltage for operating the EL element is input, and the input voltage is stepped down by the voltage step-down circuit which is provided in each unit block. The stepped-down voltage is then supplied to the driving element for driving the EL element. Therefore, even when the number of EL elements increases, sufficient source voltage can be supplied to each unit block.

The present invention also provides an electronic apparatus having an EL element driving circuit as explained above.

In the present invention, a voltage higher than the voltage for operating the EL element is input, the input voltage is stepped down by the voltage step-down circuit which is provided in each unit block, and the stepped-down voltage is then supplied to the driving element for driving the EL element. Therefore, even when the number of EL elements increases, a driving circuit which can operate at a sufficiently high speed can be realized.

DESCRIPTION OF THE PREFERRED EMBODIMENTS

Figure 1:
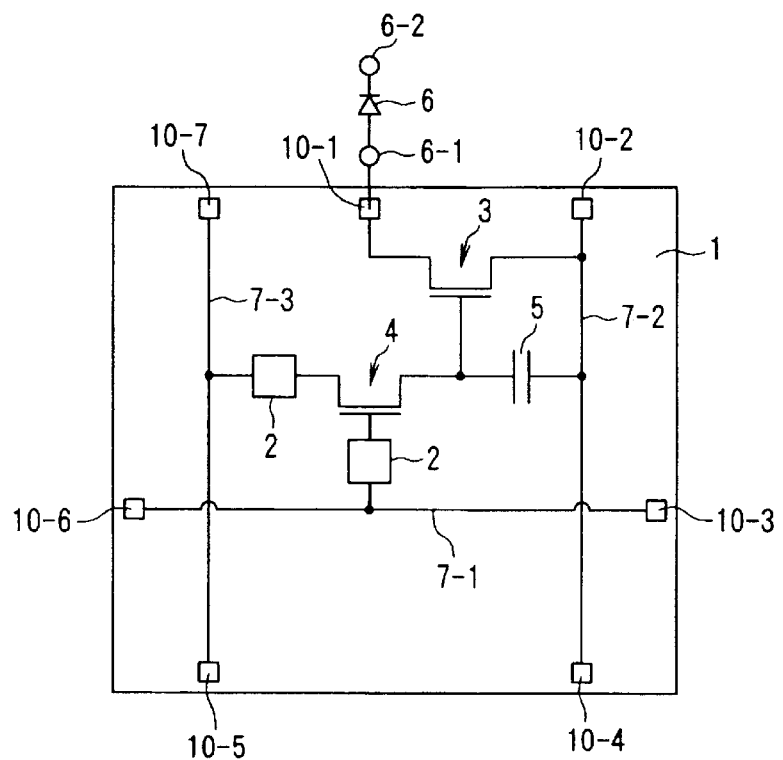
FIG. 1 is a diagram showing an embodiment of the EL element driving circuit of the present invention.

Hereinafter, embodiments according to the present invention will be explained with reference to the drawings. In the drawings, identical parts are indicated by identical reference numerals FIG. 1 is a diagram showing the general structure of an embodiment of the EL element driving circuit of the present invention. The illustrated structure has a unit block 1 fit into a concave portion which is formed on a substrate, and an EL element 6 connected to the unit block 1. The unit block 1 includes a transistor 3 for driving the EL element 6, a capacitor 5 for providing electric charge for maintaining the transistor in an ON state, and a transistor 4 for charging this capacitor 5.

This unit block 1 has pads 10-1 to 10-7 which function as external terminals. The transistor 3 drives the EL element 6 by connecting the pad 10-1 to a terminal 6-1 at the anode side of the EL element 6 which is provided outside the unit block. In this process, a terminal 6-2 functions as a cathode for making the EL element 6 emit light. A wiring line 7-1 between the pads 10-3 and 10-6 functions as a scanning line, which is used for controlling the ON/OFF state of the transistor 4. A wiring line 7-3 between the pads 10-5 and 10-7 functions as a data line, which is used for charging the capacitor 5 while the transistor 4 is in the ON state. A wiring line 7-2 between the pads 10-2 and 10-4 functions as a source voltage supply line. The EL element 6 is driven by using the supplied source voltage while the transistor 3 is in the ON state.

Additionally, a voltage step-down circuit 2 is provided in the unit block 1. The voltage step-down circuit 2 supplies a voltage for driving the transistor 4. In order to drive the EL element 6, a voltage which is higher than the specific driving voltage (for the EL element 6) by the degree decreased by the voltage step-down circuit 2 must be supplied to the wiring line 7-2 which is the source voltage supply line. This voltage step-down circuit 2 is provided in each unit block; thus, the normal voltage can be supplied to the scanning line and the data line which are provided outside of each voltage step-down circuit 2. Therefore, even when the number of EL elements increases, the scanning line and the data line can be driven at a sufficiently high speed.

Figure 2:
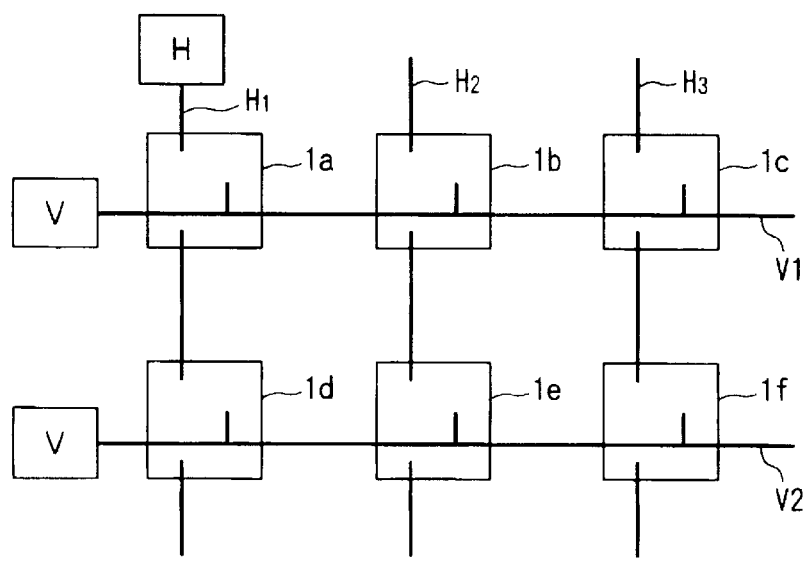
FIG. 2 is a plan view showing a state in which the block substrates, each employing the EL element driving circuit as shown in FIG. 1, are arranged on another substrate.

That is, as shown in FIG. 2, V lines V1 and V2 and H lines H1, H2, and H3 are provided on unit blocks 1a to 1f arranged in a manner such that each unit block is fit into a concave portion formed on a substrate. A voltage higher than a required voltage (i.e., the specific driving voltage for the EL element) is supplied to the unit blocks 1a to 1f via the V lines V1 and V2 and H lines H1, H2, and H3. This higher voltage is stepped down to the required voltage via the voltage step-down circuit provided in each unit block, thereby driving each EL element using the required voltage. Similarly, such a higher voltage is supplied via the V lines and H lines to the other unit blocks (not shown in the figure), and the higher voltage is stepped down to the required voltage by using the voltage step-down circuit included in each unit block.

Here, the H lines H1 to H3 are data lines as explained above, and adjacent unit blocks are connected to each other via multilayered wiring arranged in each unit block.

Figure 3A:
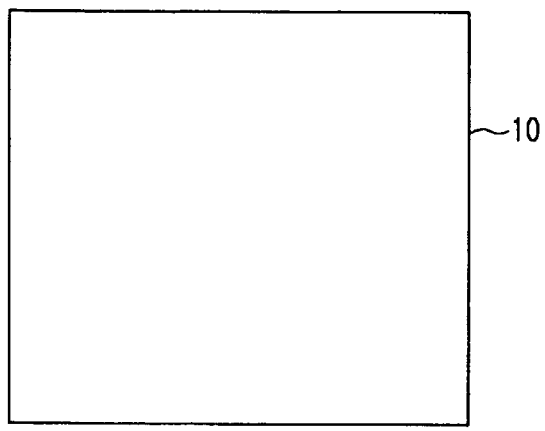
FIGS. 3A to 3C are diagrams showing the mounting process in each unit block.
Figure 3B:
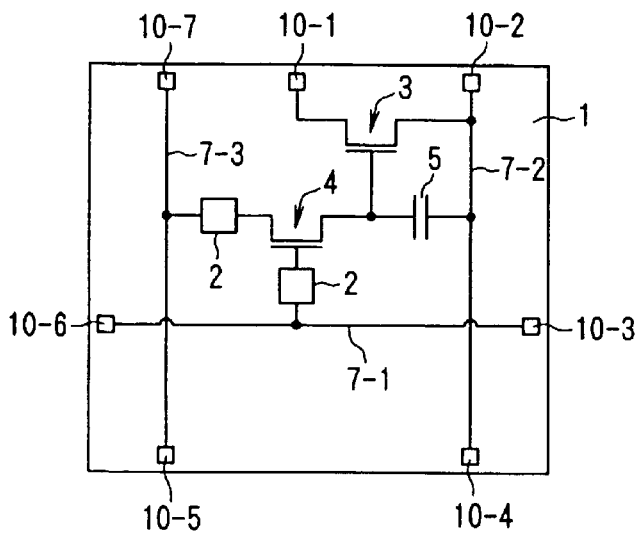

Below, the mounting process in each unit block will be explained with reference to FIGS. 3A to 3C. FIG. 3A shows a concave portion 10 into which a unit block is to be fit. The concave portion 10 has an inner form corresponding to the bottom shape of the relevant unit block which is to be fit into this concave portion. FIG. 3B shows a unit block 1, which is placed on a surface of the substrate by fitting the bottom side of this unit block 1 into the concave portion 10 shown in FIG. 3A. In addition, a voltage step-down circuit 2 is provided in advance in the unit block 1.

Figure 3C:
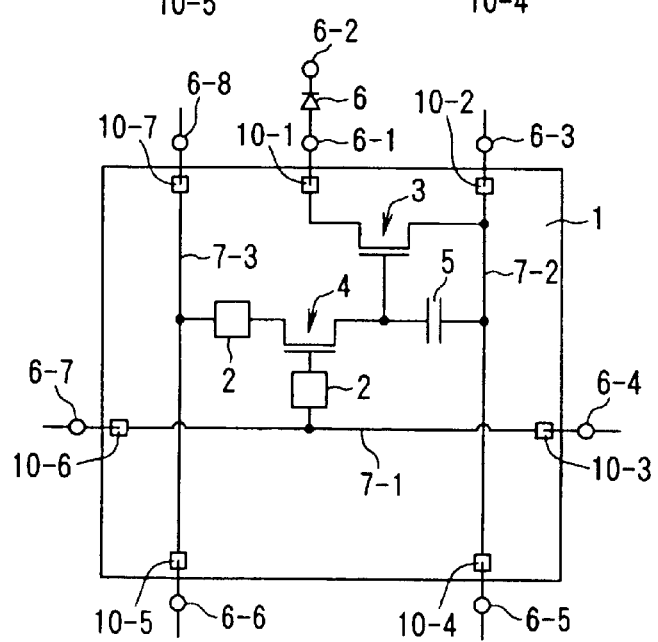

FIG. 3C shows a state in which the unit block has been fit into the concave portion and wiring connected to each pad has been completed. As shown in the figure, the pads 10-1, 10-2, 10-3, 10-4, 10-5, 10-6, and 10-7 in the unit block 1 are respectively connected to the terminals 6-1, 6-3, 6-4, 6-5, 6-6, 6-7, and 6-8 on the substrate, so that each pad in the unit block is connected to a relevant terminal on the substrate. Accordingly, the unit block is fixed to the substrate, and the above-explained data line, scanning line, and the like, are formed.

As explained above, the present circuit employs an EL element driving method in which (i) each unit block having a driving element for driving an EL element using a supplied source voltage is fit and mounted onto a substrate, (ii) the input source voltage is stepped down to a predetermined voltage by using a voltage step-down circuit provided in each unit block, and (iii) the stepped-down source voltage is supplied to the driving element for driving the EL element. The input source voltage is set to be higher than the voltage necessary for operating the EL element. According to such a method, even when the number of EL elements increases, the scanning line and the data line can be driven at a sufficiently high speed.

Figure 4:
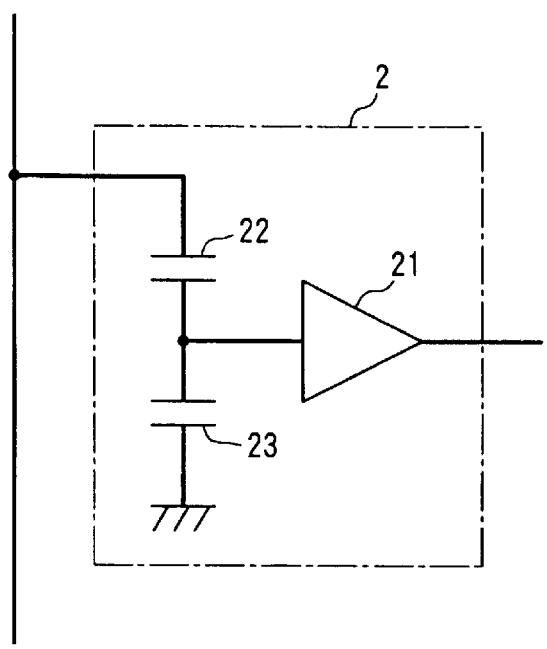
FIG. 4 is a diagram showing the structure of an example of the voltage step-down circuit in FIG. 1.

The voltage step-down circuit in each unit block may have a structure in which an intermediate electric potential is generated by dividing the capacity by using capacitors 22 and 23, and the generated intermediate electric potential is supplied to an amplifier 21 (see FIG. 4).

In an example method for making a display panel using organic EL elements, block substrates (i.e., unit blocks), each having a side of a few tens or hundreds of micrometers, obtained by dividing a substrate, are dispersed in a liquid, and the unit blocks are arranged on another substrate, which has been processed to have concave portions (or the like) into which the unit blocks are fit, by making the liquid flow on this substrate.

Figure 5:
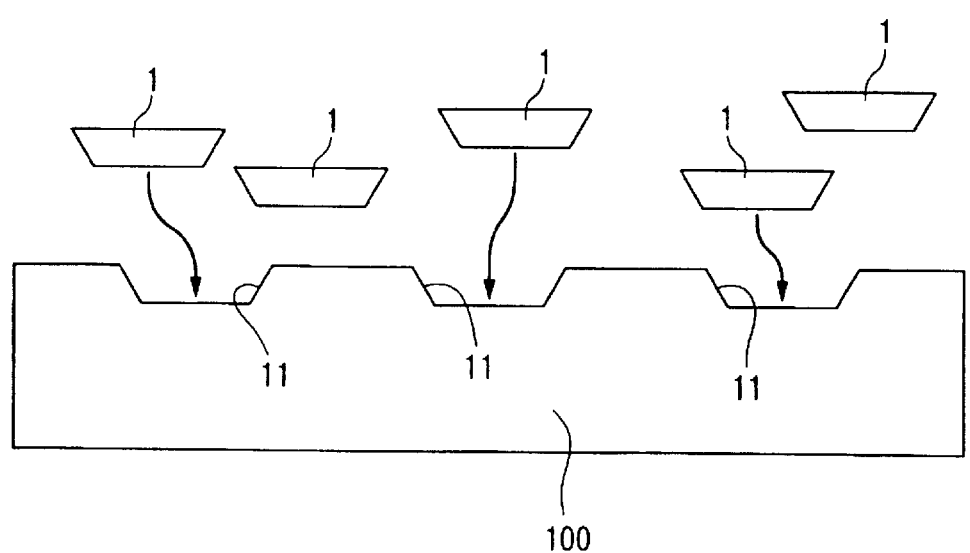
FIG. 5 is a diagram showing a state in which the block substrates are fit by making the relevant liquid flow.

Therefore, as shown in FIG. 5, a hole-formed substrate 100, in which concave portions 11, whose forms agree with the back shapes of the unit blocks 1, are formed using a press method or the like, is placed into a liquid in a manner such that the surface having the concave portions is set to be the upper face, and a number of unit blocks 1 are made to move in the liquid along the upper face of the hole-formed substrate 100, so that the unit blocks 1 are fit into the concave portions 11. After fitting the unit blocks, wiring connected to each pad is formed as explained above.

Electronic Apparatus

Below, embodiments of an electronic apparatus including an EL element driving circuit as explained above and an EL display panel driven by the EL element driving circuit will be explained.

First Embodiment

Mobile-Type Computer

Figure 6:
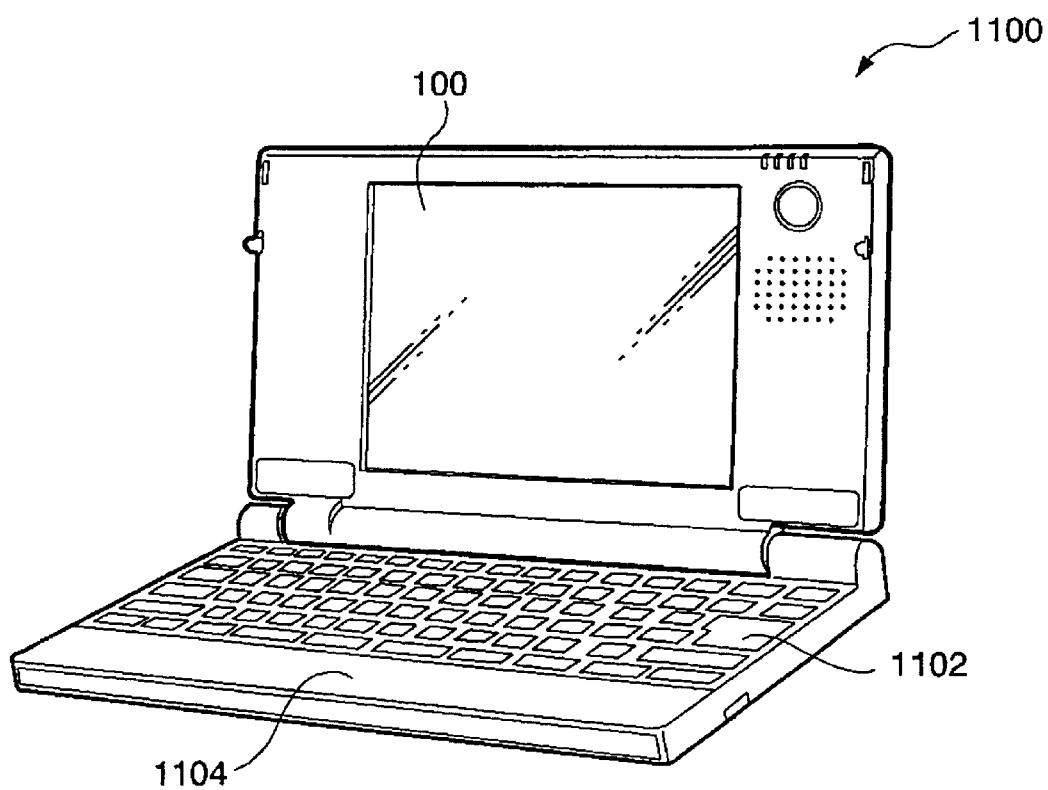
FIG. 6 is a perspective view showing the structure of a personal computer as an embodiment of the electronic apparatus according to the present invention.

First, a mobile-type personal computer to which an organic EL display panel as explained above is applied will be explained. FIG. 6 is a perspective view showing the structure of the personal computer. In the figure, a personal computer 1100 comprises a main body 1104 including a keyboard 1102, and a display unit 1106 which includes an organic EL display panel 100.

Second Embodiment

Cellular Phone

Figure 7:
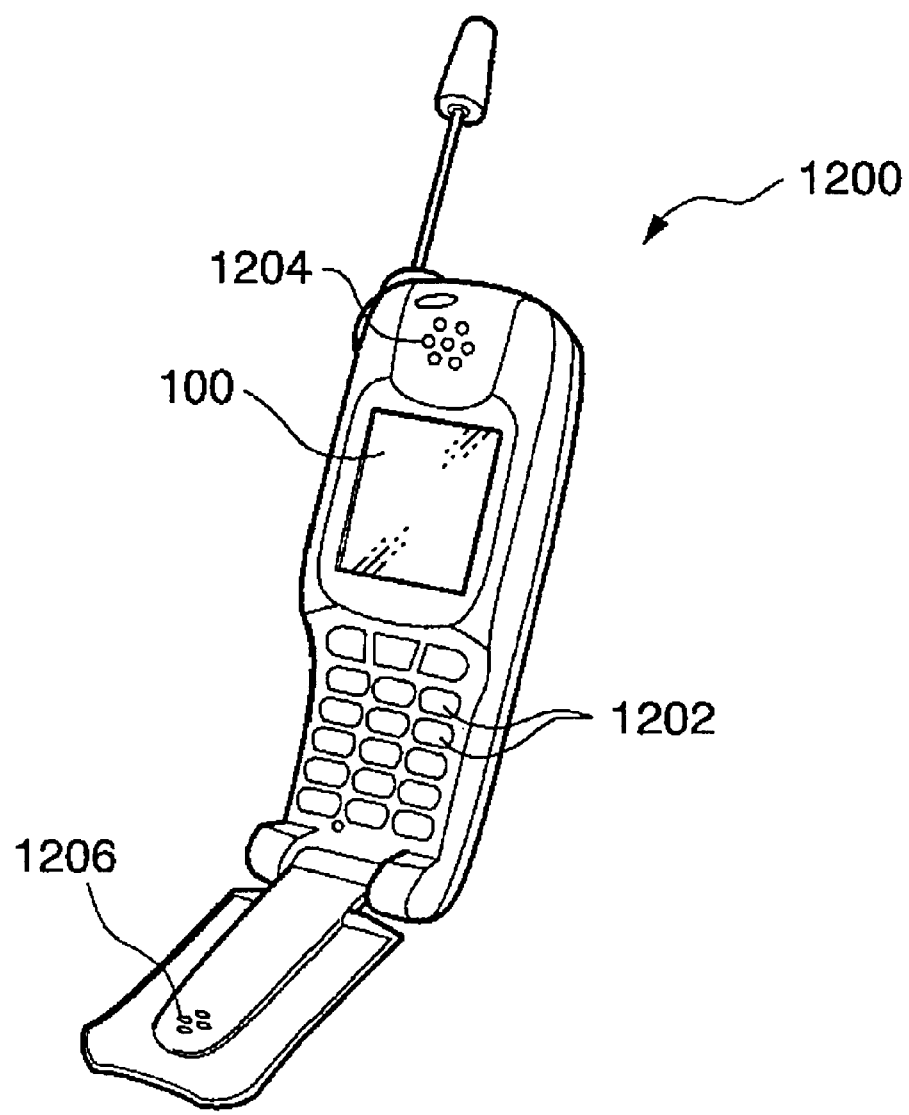
FIG. 7 is a perspective view showing the structure of a cellular phone as an embodiment of the electronic apparatus according to the present invention.

Next, an embodiment applying an organic EL display panel to a display section of a cellular phone will be explained. FIG. 7 is a perspective view showing the structure of the cellular phone. In the figure, a cellular phone 1200 comprises operation buttons 1202, an ear piece 1204, a mouth piece 1206, and an organic EL display panel 100 as explained above.

Third Embodiment

Digital Still Photography Camera

Figure 8:
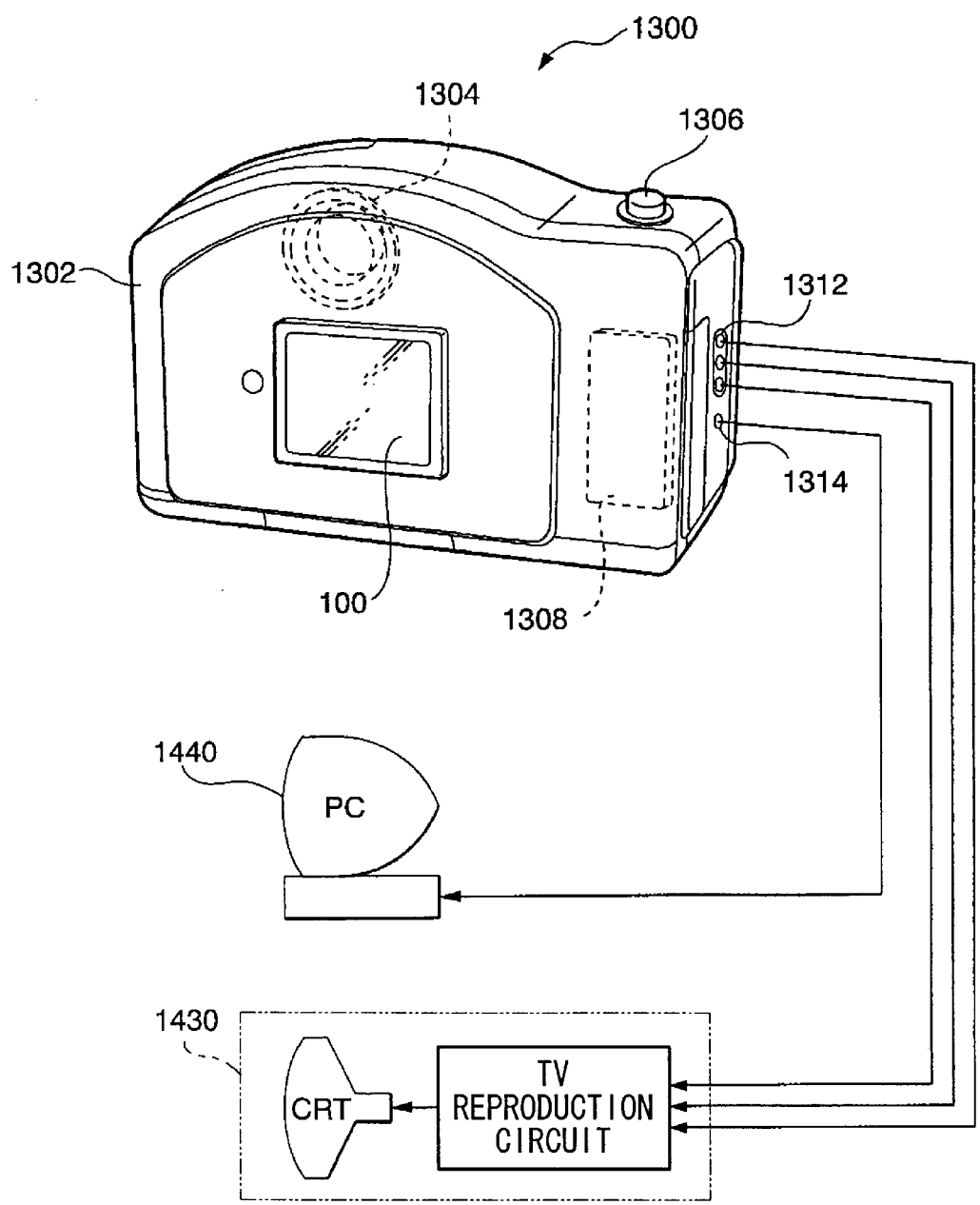
FIG. 8 is a perspective view showing the structure of the back-face side of a digital still camera as an embodiment of the electronic apparatus according to the present invention.

Furthermore, a digital still (photography) camera having a finder to which an EL element display panel is applied will be explained. FIG. 8 is a perspective view showing the structure of the digital still photography camera, where the general connection state with external devices is also shown.

In comparison with normal cameras in which film is exposed via reflected light from target objects, in the digital still camera 1300, photoelectric conversion of reflected light from target objects is performed by using an image capturing device such as a CCD (charge coupled device), so as to generate an image signal. At the back face of a case 1302 of the digital still camera 1300, an organic EL display panel 100 as explained above is provided, in which an image is shown based on an image signal obtained by the CCD. Therefore, the organic EL display panel 100 functions as a finder for displaying target objects. At the observation side of the case 1302 (in this figure, the back face side), a light receiving unit 1304 including an optical lens, CCD, and the like, is attached.

When a photographer confirms an image displayed on the organic EL display panel 100, which includes target objects, and pushes a shutter button 1306, an image signal obtained by the CCD at that moment is transferred to and stored in memory on a circuit board 1308. Additionally, the digital still camera 1300 has a video signal output terminal 1312 and a data-communication input/output terminal 1314 on a side face of the case 1302. As shown in FIG. 8, a TV monitor 1430 and a personal computer 1440 can be respectively connected to the video signal output terminal 1312 and the data-communication input/output terminal 1314, according to necessity. In addition, according to specific operations, an image signal stored in memory on the circuit board 1308 is output to the TV monitor 1430 or the personal computer 1440.

In addition to the personal computer shown in FIG. 6, the cellular phone shown in FIG. 7, and the digital still camera shown in FIG. 8, an LCD display, view-finder or direct-view-monitor type video tape recorder, car navigation apparatus, pager, PDA (Personal Digital Assistant), electronic calculator, word processor, workstation, visual telephone, POS (Point of Sale) terminal, apparatus having a touch panel, and the like, are also examples of the electronic apparatus according to the present invention. Obviously, a display device as explained above can be applied to the display section of these electronic apparatuses.

What is claimed is:

1. An EL element driving circuit for driving EL elements, provided by mounting unit blocks in a substrate, each of the unit blocks having a driving element for driving an EL element according to a supplied signal, the circuit comprising:

a voltage step-down circuit, provided in each of the unit blocks, for stepping down the voltage of said supplied signal to a predetermined voltage level, the signal having the stepped-down voltage being supplied to the driving element for driving the EL element, and said substrate having a plurality of concave portions into which the unit blocks are to be fit, and the unit blocks are fit into the concave portions in a liquid.

2. The EL element driving circuit as claimed in claim 1, the voltage of said supplied signal being higher than a voltage for operating the EL element.

3. An EL element driving method of driving EL elements, implemented by mounting unit blocks in a substrate, each of the unit blocks having a driving, element for driving an EL element according to a supplied signal, the method comprising the steps of:

stepping down the voltage of said supplied signal to a predetermined voltage level by a voltage step-down circuit provided in each unit block;

supplying the signal having the stepped-down voltage to the driving element for driving the EL element, and said substrate having a plurality of concave portions into which the unit blocks are to be fit, and the unit blocks are fit into the concave portions in a liquid.

4. The EL element driving method as claimed in claim 3, the voltage of said supplied signal being higher than a voltage for operating the EL element.

5. An electronic apparatus having the EL element driving circuit as claimed in claim 1.

6. A display panel comprising:

a substrate;

a plurality of EL elements on the substrate;

a plurality of data lines;

a plurality of scanning lines;

a plurality of unit blocks on the substrate, connected via the data lines and the scanning lines, for driving the EL elements according to signals supplied via the data lines and the scanning lines, each unit block comprising:

a driving element for driving one of the EL elements;

a voltage step-down circuit for stepping down a first voltage of a signal, which is supplied to the unit block through one of the data lines or one of the scanning lines, to a second voltage which is applied to the driving element.

7. A electroluminescent (EL) display comprising:

a substrate;

a plurality of EL elements on the substrate;

a plurality of data lines;

a plurality of scanning lines;

a plurality of unit blocks on the substrate, connected via the data lines and the scanning lines, for driving the EL elements according to signals supplied via the data lines and the scanning lines, each unit block comprising:

a transistor for driving one of the EL elements;

a voltage step-down circuit for stepping down a first voltage of a signal, which is supplied to the unit block through one of the data lines, to a second voltage which is applied to the transistor.

8. An electroluminescent (EL) display comprising:

a substrate;

a plurality of EL elements on the substrate;

a plurality of data lines;

a plurality of scanning lines;

a plurality of transistors on the substrate, each transistor for driving one of the EL elements; and a plurality of signal level step-down circuits, where each signal level step-down circuit is connected to one of the transistors and steps down a first signal level of a signal, which is supplied to the signal level step-down circuit through one of the data lines or one of the scanning lines, to a second signal level, and a voltage corresponding to the second signal level is applied to said one of the transistors.

* * * * *